United States Patent [19]

Torrieri

[11] 4,135,161
[45] Jan. 16, 1979

[54] METHOD AND MEANS FOR PULSE DETECTION

[76] Inventor: Don J. Torrieri, 3104 Cordoba St., Silver Spring, Md. 20904

[21] Appl. No.: 801,942

[22] Filed: May 31, 1977

[51] Int. Cl.² .......................................... H03K 5/153
[52] U.S. Cl. .................................... 328/108; 307/232; 307/234; 307/360; 328/114; 328/132; 328/165
[58] Field of Search ............... 328/108, 109, 110, 114, 328/117, 132, 162, 165; 307/232, 234, 354, 360

[56] References Cited
U.S. PATENT DOCUMENTS

| 3,600,688 | 8/1971 | Booth | 328/110 X |
| 3,693,028 | 9/1972 | Fussell | 328/110 X |

*Primary Examiner*—John Zazworsky
*Attorney, Agent, or Firm*—R. S. Sciascia; Philip Schneider

[57] ABSTRACT

An improved method and means for pulse detection comprising a pair of comparators with different predetermined reference signals to one of which the input pulse is applied and to the other of which the derivative of the input pulse is applied. A zero-crossing detector is fed a second derivative of the pulse and provides an output to a NAND gate when said derivative crosses zero. Each comparator provides an output to said NAND gate when its input signal exceeds its reference signal. The NAND gate is connected to one input of a flip-flop and one input of a monostable multivibrator. The other input of the flip-flop is connected to receive the output of the input signal comparator. One output of the flip-flop is connected to an inverter pair which in turn is connected to a second monostable multivibrator; the other output of said flip-flop is connected to the first multivibrator which in turn is connected to the second multivibrator. The time of receipt of an input pulse is indicated by the time of transmission of an output signal from this multivibrator.

7 Claims, 3 Drawing Figures

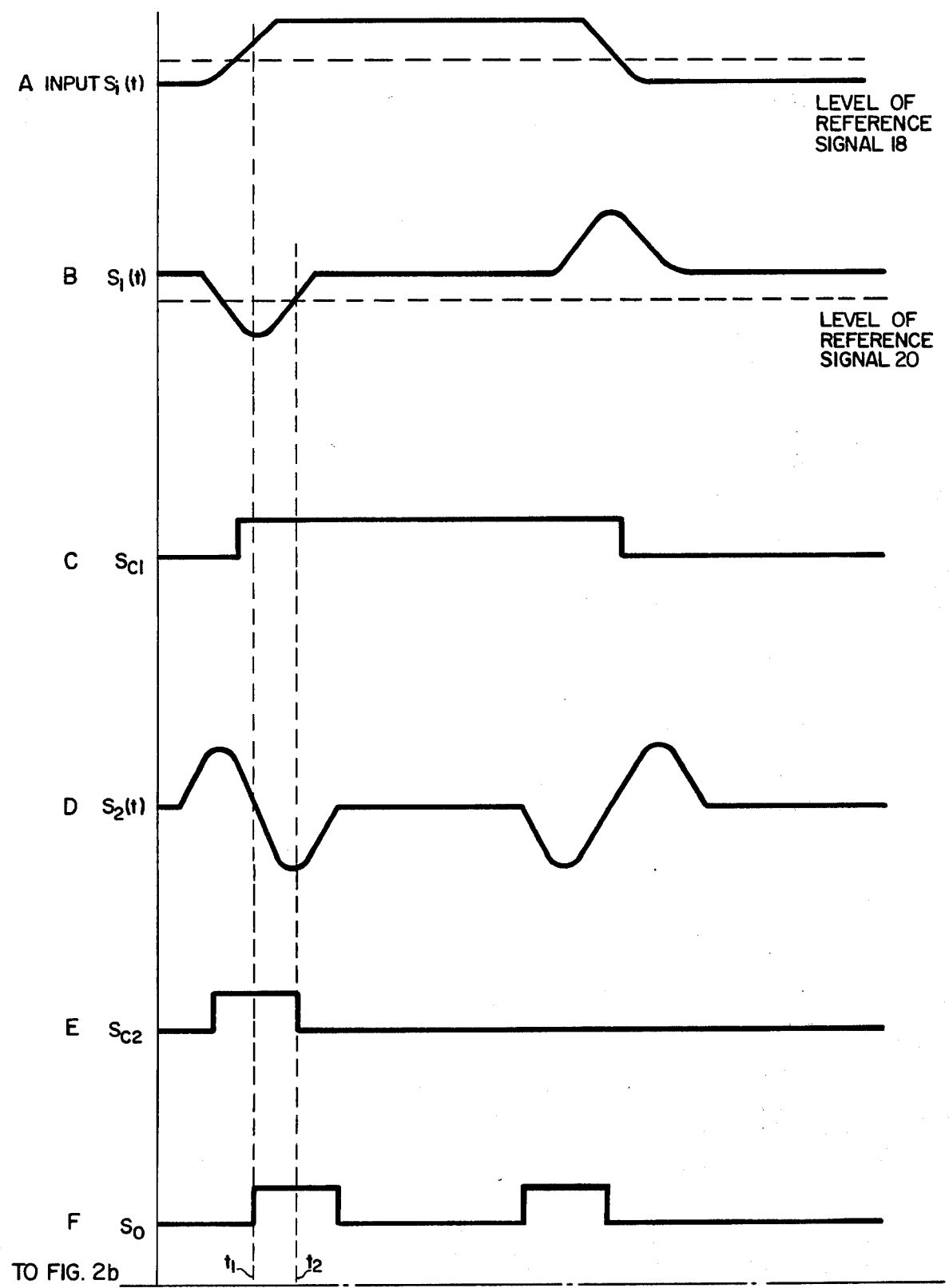

METHOD AND MEANS FOR PULSE DETECTION

BACKGROUND OF THE INVENTION

This invention relates to signal detection circuits and more particularly to circuit means which automatically determines pulse position or arrival time in a way that is independent of amplitude variations and minimizes the effects of unwanted noise on the detection circuits.

It is often necessary in nuclear spectroscopy, radar and communications systems to determine the relative time positions of a sequence of received pulses. If the pulse positions are nearly periodic or exhibit a simple recursion relation, then the conventional time discrimination methods of radar systems can be effectively employed. If not, then different techniques known as time position methods must be employed. If the shape and duration of the pulses are known, then established methods using a matched filter or methods based upon the estimation of "centroid" are used. However, if the signal structure is incompletely known, these methods will not be satisfactory.

An additional problem that arises when detecting received pulses is that they are usually accompanied by impulse and thermal noise. The former is usually caused by electrical disturbances generated externally or by neighboring systems and the latter by the primary stages of the receiving system. In pulse time systems where transmitted intelligence is desired from the timing of a pulse edge, noise may displace the pulse edge from the value corresponding to the signal. Noise impulses in effect may modulate other characteristics of the signal pulse such as amplitude, and slope of the pulse edges and width of the pulse but the ultimate result is translated into a pulse time displacement, producing a distorted intelligence signal. While there are many types of interfering noise pulses, only those that actually coincide in time with the signal edge will create any difficulty in determing the time of receipt of such edge. It is therefore desirable to eliminate, as much as possible, the effects of such noise on the detector circuit.

In the past, two methods have been used most frequently to determine the true time of receipt of an incoming signal. Both systems utilize only the slope characteristics of the incoming signal to determine its time of receipt. One such method is described in U.S. Pat. No. 3,766,411 to Arnold. This device is a peak detector which provided a signal output every time the input signal crosses zero, or whenever it has a slope of zero. While Arnold's method circumvents having an output signal which is dependent upon the maximum amplitude of the input signal, substantial noise remains which may falsely trigger the detector circuit.

The other means of timed-pulsed detection is disclosed in U.S. Pat. No. 2,975,367 to Adams and Harvey. This circuit utilizes the maximum slope of an input signal pulse to provide a time of receipt output pulse. This circuit utilizes a delay line between the input signal and output pulse indication of its receipt and is undesirable in many applications because it causes signal degradation. In addition, the means of Adams and Harvey is costly and does not provide maximum protection from false triggering due to noise.

It is therefore an object of this invention to determine the relative time position of a received signal independent of its maximum amplitude.

Another object of this invention is to determine the relative time position of a received signal without the use of a delay line.

A still further object of this invention is to determine the relative time position of a received signal by a method which minimizes the effect of signal noise.

Yet another object of this invention is to determine the relative time position of a received signal while obtaining a maximum amount of false alarm protection.

SUMMARY OF THE INVENTION

The invention is an improved means and method of time-pulse signal detection in which an output is provided corresponding to the zero-crossing point of the second derivative of the incoming signal. In addition the incoming signal and a first differentiation of it are both transmitted to different comparators to obtain an output from either if the compared signals are greater than or equal to separate reference signals. The output of the two comparators and the zero-crossing detector are fed to a NAND gate which provides an output if all three signals coincide in time. The output of the NAND gate triggers a flip-flop resettable by an output signal of the first comparator. The coincidence of outputs from the flip-flop and the NAND circuit at a first monostable multivibrator means starts an output by said system. In a similar manner, the presence of an output from the Q terminal of the flip-flop and the output of the first multivibrator means cause a second monostable multivibrator means to output a signal. The time at which this signal starts is closely associated with the time at which the leading edge of the incoming pulse signal was received.

BRIEF DESCRIPTION OF THE DRAWING

FIGS. 2a and 2b are graphs of an input signal and several voltage waveforms it induces at several different points in the circuit of FIG. 1.

DESCRIPTION OF THE PREFERRED EMBODIMENT

Figure 1:
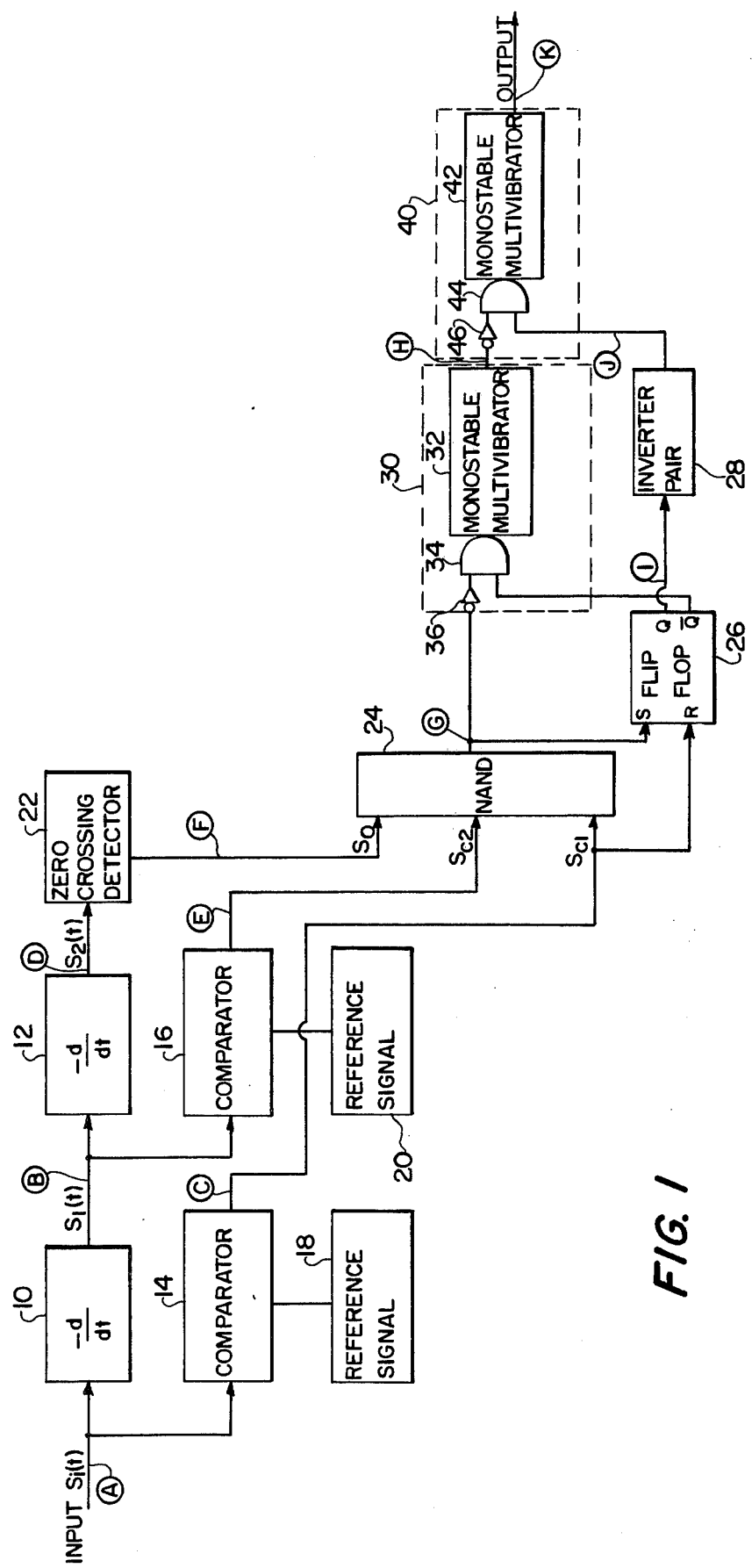
FIG. 1 is a schematic diagram of an embodiment of the present invention.

FIG. 1 illustrates a schematic diagram in which an input signal is applied to a first differentiator 10 and a first comparator 14. A reference signal 18 is also applied to the first comparator 14. The output of first differentiator 10 is applied to a second differentiator 12 and a second comparator 16. A second reference signal 20, different from the first reference signal 18, is also applied to the second comparator 16. The output of the second differentiator 12 is applied to a zero-crossing detector 22. The logic outputs of zero-crossing detector 22, first comparator 14 and second comparator 16 are applied to a NAND gate 24. The output of the first comparator 14 ($Sc_1$) is also applied to the reset terminal (R) of a storage means, in this case a flip-flop 26. The output of the NAND gate 24 is connected to the set terminal (S) of the flip-flop and also to an input of a monostable multivibrator means 30. Said multivibrator means is composed of an inverter 36 connected to one input of an AND gate 34 whose output is connected to a standard monostable multivibrator 32. These three components are standard components contained in monostable multivibrator chips manufactured by such companies as Texas Instruments, but separate inverters, AND gates and monostable multivibrator elements may be used if desired. Because the inverter 36 is a standard component of monostable multivibrator means 30, the use of NAND gate 24 is necessary in place of an AND gate. An AND gate may be used where the signal is not inverted before transmission to the monostable multivibrator 32.

The not output ($\overline{Q}$) of the flip-flop is connected to another input of AND gate 34. The output (Q) of the flip-flop is connected to the inverter pair 28, a pair of inverters in series, whose output in turn is connected to an input of AND gate 44 which is a component contained in a second monostable multivibrator 40. The output of first monostable multivibrator means 30 is connected to a second inverter 46 which is connected to another input of AND gate 44. As previously stated, separate components may be utilized in place of the second monostable multivibrator 40 so long as the resulting logic patterns described below remain the same. The AND gate 44 is connected to a second monostable multivibrator 42 whose output constitutes the output of the system and is directly associated with the time of detection of the input or received signal.

In operation, the received signal is applied to both a first differentiator 10 and a first comparator 14. Whenever the signal is greater than a predetermined threshold, the comparator transmits a logic 1 signal to NAND circuit 24. The reference signal level is set below the minimum value of the desired pulse amplitude range. The first differential of the received signal is transmitted to a second comparator 16 and a second differentiator 12. This first derivative signal provides the key to false alarm protection for the invention since the derivative of the noise contained in the received signal is statistically independent of the original noise in the received signal.

It is a well known theorem that when two Gaussian processes are uncorrelated, they are statistically independent. (See Anthanasois Papoulis, Probability, Random Variables and Stochastic Processes, 315-317 (McGraw Hill 1965). The invention utilizes this theorem in that the noise associated with the input signal and the first derivative of the noise associated with that signal are uncorrelated Gaussian processes. Therefore, the second comparator 16 will produce an output signal when the first derivative of the input signal is below the predetermined reference level of that comparator. The maximum negative amplitude of the first derivative of the input signal occurs at the point of maximum slope of the input signal. Since the reference level is set lower than the expected noise level the second comparator 16 will produce an output substantially independent of the noise associated with the received input signal. The output of this second comparator 16, $Sc_2$, is transmitted to the NAND gate 24.

The second derivative of the received signal is transmitted to a zero-crossing detector 22. Whenever the second derivative crosses zero, i.e., whenever the rate of change of the slope of the received signal is zero, detector 22 produces a logical output which is transmitted to NAND gate 24 as signal $S_o$.

The use of the second derivative of the received signal, in addition to the use of the first derivative and the received signal itself, provides additional false protection against noise-triggered outputs because it requires that the received signal pass three relevant tests performed upon it, and it can be shown statistically that the chance of a noise signal passing all three tests is slight indeed.

The three logic signals generated by the received input signals: $S_o$, from the zero-crossing detector; $Sc_2$, from the second comparator; and $Sc_1$, from the first comparator, are transmitted to the NAND gate. When all three signals are logic 1, the output of the NAND gate will be a logic 0. For any other input combination of logic values, the output of the NAND gate will remain a logic 1. Thus, a logic 0 output is transmitted by the NAND gate only when both the input signal and its first derivative $S_i(t)$ and $S_1(t)$ exceed predetermined values (indicating that the input signal is probably a true signal), and when the second derivative of the input signal $S_2(t)$ has crossed zero.

The logic 0 output of the NAND gate is transmitted to the inverter 36 and presents a logic 1 input to the AND gate 34. The flip-flop is initially in the state where $Q=0$ and $\overline{Q}=1$. There is then a concurrence of logic 1 inputs at AND gate 34 which causes monostable multivibrator 32 to turn on. The multivibrator output changes from 0 to 1 and remains in that state for a predetermined period of time. The flip-flop 26 also receives the logic 0 signal from the NAND gate, but has inherently more delay time in reacting than the multivibrator and latches or changes state immediately after the multivibrator turns on. This change in state of the flip-flop 26 results in $Q=1$ and $\overline{Q}=0$. The flip-flop cannot reset at this point in the operation of the circuit because of $Sc_1$. The input signal to the reset of the flip-flop remains at the steady-state of logic 1. The flip-flop will not reset unit $Sc_1$ changes state to logic 0. This condition will not occur until the received signal falls below the reference level of comparator 14, indicating that no signal greater than the noise level is present. However, there is again an inhibiting input to the multivibrator 32 since $\overline{Q}=0$. It should be noted that multivibrator 30 must be of the retriggerable type in order to obtain quick system recovery in the event of the receipt of a noise spike greater than the predetermined reference levels of the comparators which would cause the NAND gate to change state and trigger the multivibrator 30.

The logic 1 output from the Q terminal of flip-flop 26 is transmitted to monostable multivibrator 40 through the inverter pair 28. The inverter pair provides a digital delay that ensures that the signal from the Q terminal arrives at the monostable multivibrator 40 later than the signal from the first monostable multivibrator. This provides protection from false triggering due solely to the leading edge of the Q signal. When the signal from multivibrator 30 changes state from 1 to 0, the second monostable multivibrator will change state from 0 to a logic 1 output for a preset period of time. The output pulse represents the time of receipt of the input signal, but is slightly delayed in time from that signal. It is not necessary that the second monostable multivibrator be retriggerable.

This system and method provides an output signal indicative of the time of receipt of a true signal when the received signal is of sufficient magnitude and of a duration large enough to cause the output of the first comparator 14, $Sc_1$, to exceed the time duration of the output of monostable multivibrator 30; where simultaneously, the received signal causes $S_0$ and $Sc_2$ to go to logic 1 signals. Discrimination between "true" and "false" signals is provided by utilizing both signal amplitude, derivative, and duration characteristics. When a true signal has been determined and multivibrator 30 is turned on, the trailing edge of the output of the first multivibrator will trigger the second multivibrator 40.

The signal thus transmitted by the second multivibrator indicates the receipt of a true signal.

Appropriate adjustment of the reference level to the second comparator 16 allows additional false alarm protection for the system. When the propagation delay due to the differentiators is substantial, triggering of the first monostable multivibrator can be prevented by digitally delaying $Sc_2$ before it reaches the NAND gate. Both $Sc_2$ and the flip flop $\overline{Q}$ output prevent multiple triggerings of the first multivibrator during a single input signal.

Thus, the system and method disclosed requires that the input-signal noise trigger all three inputs to the NAND gate to obtain a false pulse signal. Such an occurrence is highly unlikely.

Figure 2B:
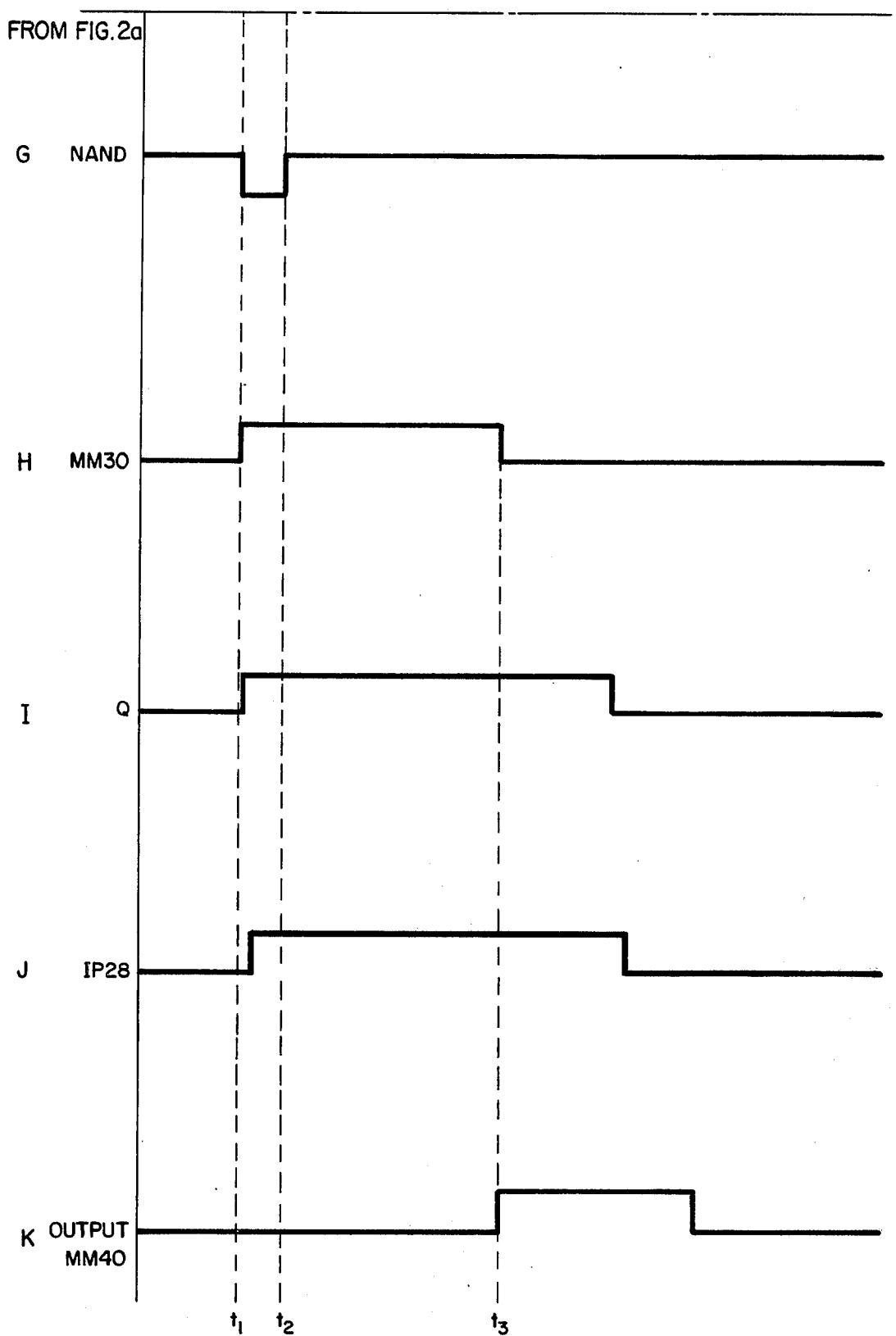

FIGS. 2a and 2b are graphic representations of the signals present within the invention at the points specified. $S_i(t)(A)$ represents the input signal, $S_1(t)(B)$ the negative first derivative of $S_i(t)$ and $S_2(t)$ (D), the second derivative of $S_i(t)$.

As long as the amplitude of $S_i(t)$ equals or exceeds the level of reference signal 18, signal $Sc_1(C)$ remains at a logic 1 level. As long as the amplitude of $S_1(t)$ equals or is below the level of reference signal 20, signal $Sc_2(E)$ remains at a logic 1 level. Finally, whenever $S_2(t)$ crosses zero, the zero-crossing detector 22 will provide a logic 1 output, $S_o(F)$.

Whenever these three logic signals (C, E, and F) are all at the 1 level, the output from the NAND gate (G) will fall from a logic 1 level to a logic 0 level. This occurs at time $t_1$. The change in state of the output of the NAND gate triggers monostable multivibrator 30 at time $t_1$, to transmit a logic 1 output, (H), for a predetermined period, being at least the minimum amount of time which determines an acceptable signal width. While the change in state of the output of the NAND gate activates the flip-flop, at time $t_1$, the flip-flop is somewhat slower to react and thus the Q output (I) changes state after the monostable multivibrator turns on.

By time $t_2$, $S_1(t)$ is no longer sufficient to maintain $Sc_2$ at a logic 1 level and the NAND gate again changes state and returns to a logic 1 level.

At time $t_3$, the Q output after having been delayed by inverter pair 28 arrives at the second monostable multivibrator 40 either simultaneously with or after the change in state of the first multivibrator from logic 1 to logic 0. The arrival of the IP 28 signal (J) from the inverter pair allows the trailing edge of monostable multivibrator 30 to trigger the second monostable multibibrator which transmits an output (K) which is delayed in time from the time of receipt of the leading edge of the received input signal from which it results.

When a large noise spike occurs immediately preceding a true signal, the retriggerable characteristic of the first monostable multivibrator will cause its output pulse to become extended in time a corresponding period such that the operation of the disclosed invention is not interrupted.

It should be noted that the disclosed invention has been described for the zero propagation delay case. If some propagation delay time is present, inverter pairs connected between the comparators and the inputs of the NAND gate will compensate for such a delay.

It should further be noted that wherever inverter pairs of the digital delays are taught in the present invention, they may be replaced by delays inherent in the circuitry which comprises the invention.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A method of detecting pulses, comprising the steps of:

applying an input signal to a first differentiating means and a first comparing means;

differentiating said input signal and transmitting a first differentiated signal to a second differentiating means and a second comparing means;

comparing said input signal and said first differentiated signal to different predetermined reference signals and obtaining an output from each comparing means whenever said input signal and said first differentiated signal is greater than its respective reference signals;

differentiating said first differentiated signal and obtaining a second differentiated signal;

generating a zero-crossing signal whenever said second differentiated signal crosses zero;

generating a logic output whenever said zero-crossing, first differentiated and second differentiated signals occur simultaneously; and utilizing said logic output to trigger an output signal associated in time with said input signal.

2. The method of claim 1, wherein said output signal is triggered by applying said logic output to a series combination of two monostable multivibrators.

3. The method of claim 1, wherein said logic output is generated by a NAND gate.

4. A system for detecting pulses and providing an output signal corresponding thereto, comprising:

a first differentiating means to which the input pulse is applied:

a first comparing means for providing an output when the input pulse exceeds a first predetermined reference level;

a first reference signal applied to said first comparing means for providing said first predetermined reference level;

a second differentiating means connected to said first differentiating means;

a second comparing means connected to said first differentiating means for providing an output when the output of said differentiating means exceeds a second predetermined reference level;

a second reference signal applied to said second comparing means for providing said second predetermined reference level;

zero-crossing detecting means connected to said second differentiating means for providing an output whenever the output of said differentiating means crosses zero;

monitoring logic means connected to the outputs of said zero-crossing detecting means and said first and second comparing means for providing a change in state of its logic output when it receives an output from said zero crossing detecting and first and second comparing means;

storage means whose inputs are connected to the output of said first comparing means and the output of said monitoring logic means;

first retriggerable monostable multivibrator means connected to the output said monitoring logic means and one output of said storage means for providing an output for a predetermined period of time in response to a change in state of its input signals;

digital delay means connected to one output of said storage means for providing a digital delay; and a second monostable multivibrator means connected to said first monostable multivibrator and said digital delay means for providing an output signal when its input signals change state whereby said output signal is associated in time with said input signal.

5. The system of claim 4, wherein said monitoring logic means comprises a NAND gate.

6. The system of claim 4, wherein said storage means comprises a flip-flop.

7. The system of claim 4, wherein said digital delay means comprises a series connected pair of inverters.